(12) United States Patent
Pessolano et al.

(10) Patent No.: US 7,515,074 B2
(45) Date of Patent: Apr. 7, 2009

(54) CODING INFORMATION IN INTEGRATED CIRCUITS

(75) Inventors: Francesco Pessolano, Eindhoven (NL); Victor Emmanuel Stephanus Van Dijk, Eindhoven (NL)

(73) Assignee: NXP B.V., Eindhoven (NL)

(*) Notice: Subject to any disclaimer, the term of this patent is extended or adjusted under 35 U.S.C. 154(b) by 195 days.

(21) Appl. No.: 10/527,551

(22) PCT Filed: Aug. 6, 2003

(86) PCT No.: PCT/IB03/03496

§ 371 (c)(1), (2), (4) Date: Mar. 11, 2005

(87) PCT Pub. No.: WO2004/025838

PCT Pub. Date: Mar. 25, 2004

(65) Prior Publication Data

US 2005/0270194 A1   Dec. 8, 2005

(30) Foreign Application Priority Data

Sep. 13, 2002   (EP)   ................... 02078779

(51) Int. Cl.
*H03M 5/14* (2006.01)

(52) U.S. Cl. .............. 341/72; 341/50; 341/51; 341/71; 341/73; 375/201; 375/349; 375/350

(58) Field of Classification Search ........ 341/172, 341/50, 51, 71, 72, 73; 375/201, 349, 350, 375/478, 487

See application file for complete search history.

(56) References Cited

U.S. PATENT DOCUMENTS

| | | | | |
|---|---|---|---|---|
| 3,084,223 A * | 4/1963 | Marcatili et al. | ............ | 370/201 |
| 4,586,176 A * | 4/1986 | Miyao | .................. | 370/352 |
| 5,493,588 A * | 2/1996 | Lennen | ................ | 375/343 |
| 6,034,986 A * | 3/2000 | Yellin | .................. | 375/148 |
| 6,731,622 B1 * | 5/2004 | Frank et al. | ............... | 370/342 |
| 6,958,721 B2 * | 10/2005 | Vincent et al. | ............ | 341/157 |
| 7,042,931 B2 * | 5/2006 | Ogami | ................. | 375/150 |
| 7,167,523 B2 * | 1/2007 | Mansur | ............... | 375/242 |
| 7,196,526 B2 * | 3/2007 | Vincent et al. | ............ | 324/617 |
| 2001/0055344 A1 * | 12/2001 | Lee et al. | ................ | 375/257 |
| 2003/0086482 A1 * | 5/2003 | Shimizu et al. | ........... | 375/147 |
| 2003/0200475 A1 * | 10/2003 | Komoto | ............... | 713/400 |
| 2007/0271535 A1 * | 11/2007 | Hwang et al. | ............ | 716/5 |

* cited by examiner

*Primary Examiner*—Linh V Nguyen
(74) *Attorney, Agent, or Firm*—Aaron Waxler (57) ABSTRACT

A method for coding information in an electronic circuit and an electronic circuit for coding information uses at least two electrically coupled signal paths (X0, X1). Cross-talk between two electrically coupled signal paths (X0, X1) can be utilized to perform logical computation. A signal is propagating on two signal paths (X0, X1) in the form of either rising or falling transitions. The relative delay between the transitions on the two paths (X0, X1) determines the logic value of the output signal (X) to be produced. If the signal on the first paths (X0) propagates faster than the signal on the second path (X1), an output signal (X) having a first logic value is produced. If the signal on the second path (X1) propagates faster than the signal on the first path (X0), an output signal (X) having a second logic value is produced.

10 Claims, 7 Drawing Sheets

CODING INFORMATION IN INTEGRATED CIRCUITS

The present invention relates to a method for coding information in an electronic circuit and an electronic circuit for coding information, said circuit comprising at least two electrically coupled signal paths.

A well-known electrical phenomenon known as cross-talk exists among signal paths that are electrically coupled to each other. Cross-talk manifests itself by inducing voltage glitches on electrically coupled signal paths, which is seen as an undesired disturbance that has to be minimized. Cross-talk also manifests itself by modifying the speed of the signals travelling on these signal paths. Normally, neighboring signal paths will affect each other to a greater extent than paths located some distance away from each other, since the closer they are located to each other, the stronger the electrical coupling will be.

For instance, consider two electrically coupled signal paths in an IC. This is normally the case when two parallel extending signal paths are located closely together. If a signal transition occurs on a signal path, it will propagate along the path with a given speed, reaching the end of the path within a given delay time. If, on the other hand, a signal transition occurs on both paths and the transition on each path is in the same direction, both transitions will propagate at a higher speed. The transitions will therefore reach the end of the path with a shorter delay. Cross-talk is thus effectively modulating the delay of signals propagating along signal paths being electrically coupled to each other. These effects are in the prior art usually seen as problems that have to be minimized or eliminated.

For example, GB 2,089,122 discloses a semiconductor integrated circuit (IC) and seeks to reduce interference between signal lines thereof. On a substrate of the IC, a first, second and third signal line is formed. The first signal line transmits a first signal, and the third signal line transmits a third signal having a phase which is opposite to that of the first signal. Thus, the cross-talk from the first signal line to the second signal line can be cancelled by the cross-talk from the third signal line to the second signal line, on which a second signal is transmitted.

It is a drawback that dedicated hardware has to be added to the integrated circuit for the sole purpose of eliminating cross-talk, especially when taking into consideration that the ongoing increase in integration density on ICs will lead to more pronounced occurrences of cross-talk, and a further increase in the required additional hardware, which has negative implications for the silicon real estate of the IC.

Amongst others, it is an object of the present invention to provide an improved method and electronic circuit for coding information.

This object is achieved by the invention in a first aspect in the form of a method for coding information in an electronic circuit, said circuit comprising at least two electrically coupled signal paths according to claim 1 and in a second aspect in the form of an electronic circuit for coding information, said circuit comprising at least two electrically coupled signal paths according to claim 6. This has the advantage that cross-talk related additional hardware is utilized to generate useful information rather than to merely eliminate or reduce an effect that will become more and more pronounced with increasing integration densities on ICs. So, in accordance with the invention, cross-talk is being utilized rather than being countered.

According to the first aspect of the invention, a method for coding information is provided wherein the relative delay between signals propagating on at least two electrically coupled paths is determined when the signals make a transition from a first logic level to a second logic level. An output signal is then produced having a further logic level depending on the relative delay between the signals.

According to the second aspect of the invention, an electronic circuit for coding information is provided comprising means arranged to determine the relative delay between signals propagating on at least two electrically coupled paths when the signals make a transition from a first logic level to a second logic level. The electronic circuit further comprises means arranged to produce an output signal having a further logic level depending on the relative delay between the signals.

The invention is based on the idea that cross-talk between two electrically coupled signal paths can be utilized to perform a logical computation. A signal is propagating on two signal paths in the form of either rising or falling transitions. The relative delay between the transitions on the two paths determines the further logic value i.e., a logic "0" or a logic "1", of the output signal to be produced. This is hereinafter referred to as "delay coding". If the signal on the first path propagates faster than the signal on the second path, an output signal of a first further logic value is produced. If the signal on the second path propagates faster than the signal on the first path, an output signal of a second further logic value is produced.

By employing the concept of delay coding, it is possible to implement logic gates performing computation by means of cross-talk, which is used to modify the speed of transitions propagating on electrically coupled signal paths and thus modulating delays. This is advantageous since logic gates comprised of transistors can be replaced by logic gates comprised of electrically coupled signal paths. Transistors are only needed when conversion is to be done between the boolean domain, where signal values are represented by logic levels, and the delay domain where signal values are represented by the difference in arrival time of signals.

According to an embodiment of the invention, a logical signal is divided into two delay coded signals propagating on respective electrically coupled signal paths. A relative delay between the two delay coded signals is created by means of a delay encoder, e.g. a programmable delay circuit, a buffer or some other type of circuit having an inherent delay. Thereby, the conversion between the boolean domain, i.e., the standard digital binary domain, and the delay coding domain is performed. Standard delay decoders, for example metastability filters, can be used to convert delay coded signals to binary signals.

The present invention will be described in greater detail with reference made to the accompanying drawings, in which.

Figure 1:
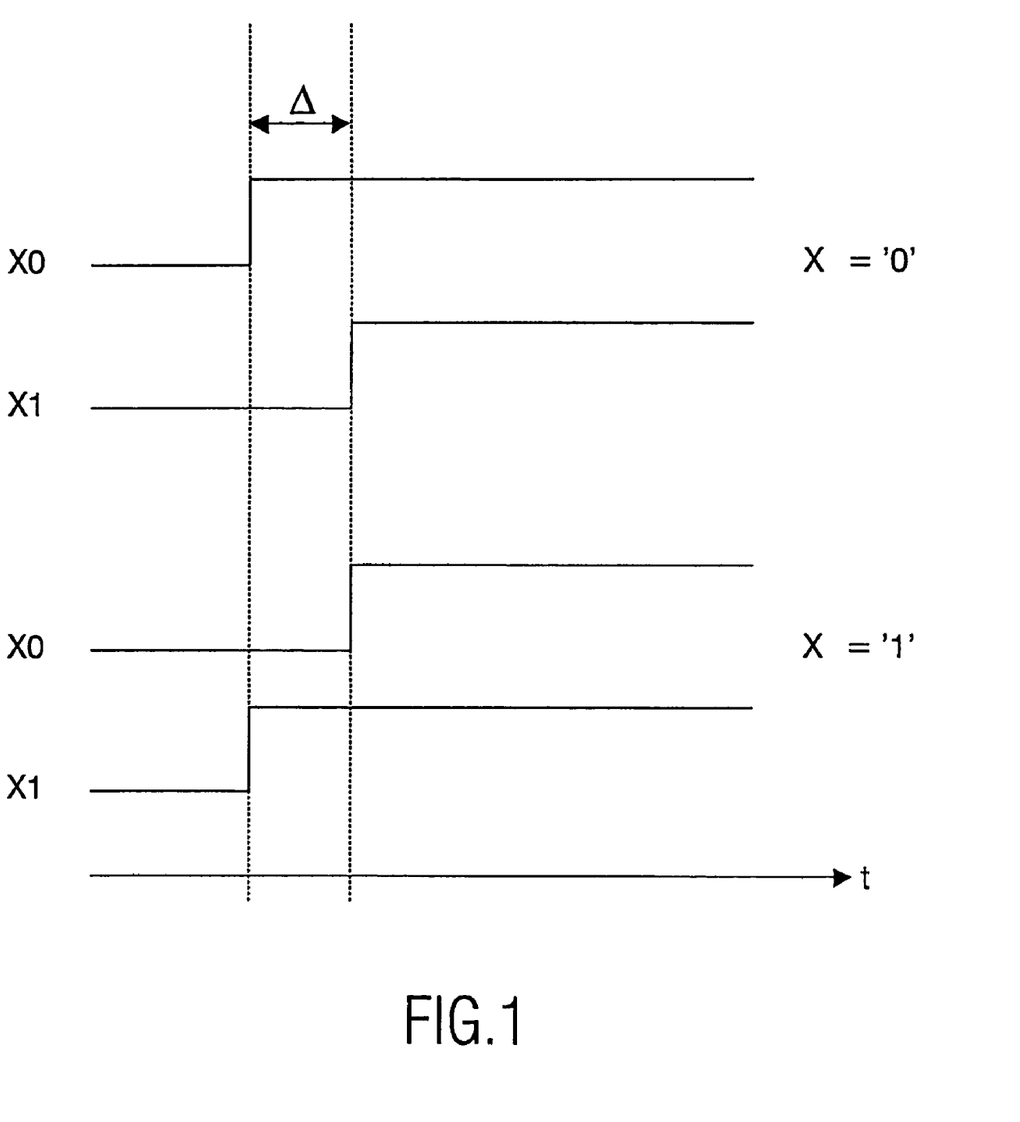
FIG. 1 shows an embodiment of delay coding according to the invention.

FIG. 1 shows an embodiment of delay coding according to the invention. In delay coding two signal paths X0, X1 are needed for each binary variable X. The signal paths X0, X1 are constituted of for example wires, copper lines on a printed circuit board, signal lines in an integrated circuit etc. In order for cross-talk to emerge, electrical coupling between the signal paths X0, X1 must exist, which usually is the case among neighboring signal paths X0, X1. A signal is propagating on both signal paths X0, X1 in the form of either rising or falling transitions. The relative delay A between the transitions on the two paths X0, X1, i.e, when the signals make a transition from a first logic level to a second logic level, e.g., a "0"→"1" transition or a "1"→"0" transition, determines the logic value of the output signal X to be produced. If the signal propagating on path X0 propagates faster than the signal on path X1, X has the logical value "0". If the signal propagating on path X0 propagates slower than the signal on path X1, X has the logical value "1". The delay coding scheme is the same for falling transitions. The further logic value, i.e., a logic "1" or "0", that is assigned to the output depending on the relative delay between the signals, i.e., depending on which of the signals propagates faster, is a mere matter of choice, i.e., convention. However, hereinafter the conventional delay coding scheme shown in FIG. 1 will be used.

Figure 2:
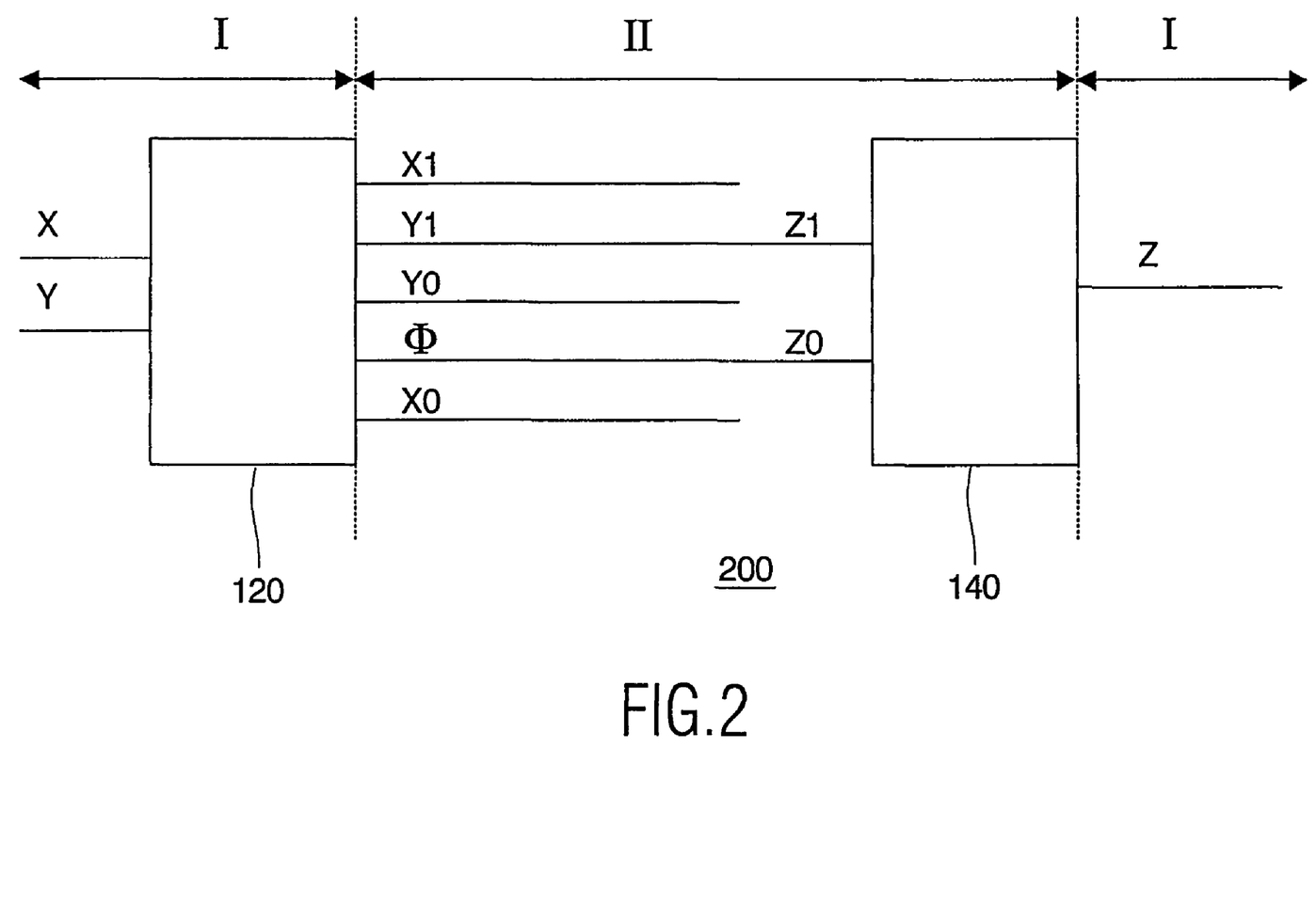
FIG. 2 shows another embodiment of delay coding according to the invention, in which embodiment an AND gate is implemented.

FIG. 2 shows another embodiment of delay coding according to the invention, in which embodiment an AND gate 200 is implemented. As mentioned earlier, the delay encoder 120 and the delay decoder 140 are standard electronic components utilized to make the conversion between the boolean domain I and the delay coding domain II and vice versa. Assume that variables X and Y are delay coded as described in FIG. 1. The signal propagating on signal path Φ is a reference transition synchronized with the fastest signal propagating on either of the signal paths X0, X1, Y0 and Y1. Three possible scenarios can occur:

1. Signals X and Y are both equal to logic "1". In this case the transitions on X1 and Y1 are faster than the transitions on X0 and Y0 in accordance with FIG. 1 and synchronized with the reference.
2. Signals X and Y are both equal to logic "0". In this case the transitions on X0 and Y0 are faster than the transitions on X1 and Y1 in accordance with FIG. 1 and synchronized with the reference.
3. The logical value on signals X and Y differ. In this case either the transitions on X0 and Y1 or the transitions on X1 and Y0 are faster in accordance with FIG. 1 and either the transitions on X0 or Y0 are synchronized with the reference.

In case 1, the signals propagating on X0 and Y0 do not influence the neighboring reference since they are slower than the reference while Y1 is accelerated by X1. Consequently, the transition on Z1 is faster than the transition on Z0 and thus, in accordance with FIG. 1, Z is equal to logic "1".

In case 2, the signals on X0, X1, Y0 and Y1 are all accelerated. However, the signals propagating on X0 and Y0 now accelerate the neighboring reference. Consequently, the transition on Z0 is faster than the transition on Z1 and thus, in accordance with FIG. 1, Z is equal to logic "0".

In case 3, either the signals propagating on X0 or Y0 are synchronized with the neighboring reference and, as a consequence, are able to accelerate the reference. As the signal on Y1 is not accelerated, the transition on Z0 is faster than the one on Z1. Consequently, in accordance with FIG. 1, Z is equal to logic "0".

Hence, studying these three cases, it can be seen that the circuit in FIG. 2 implements an AND gate 200.

Figure 3:
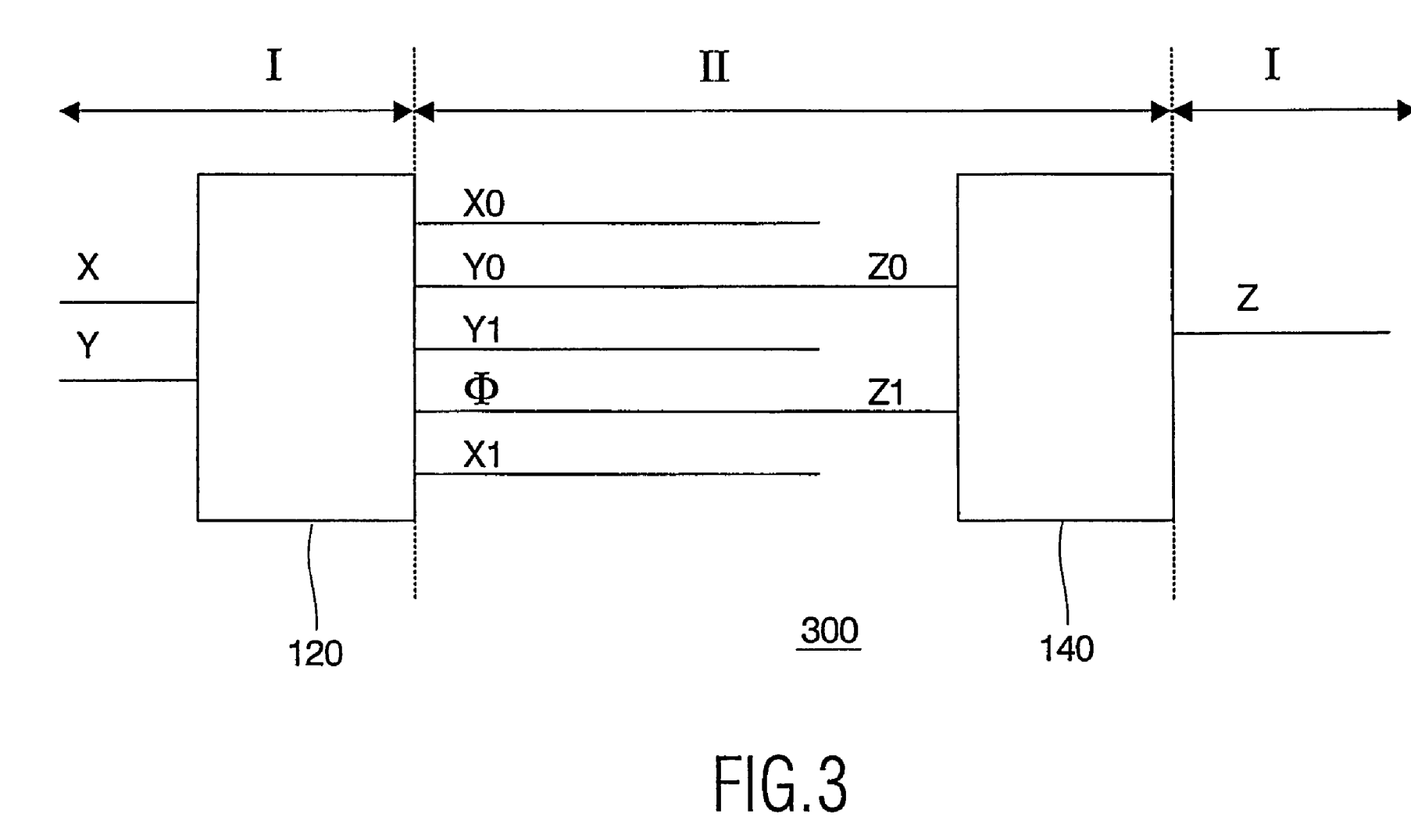
FIG. 3 shows another embodiment of delay coding according to the invention, in which embodiment an OR gate is implemented.

By applying a similar reasoning, the function of an OR gate 300 as shown in FIG. 3 can be verified.

It will be understood by those skilled in the art that in the context of the present invention, the verb 'to accelerate' is used to indicate the difference between a signal propagation speed on a wire caused by advantageous signal propagations on neighboring wires, and a signal propagation speed on a wire having no advantageous signal propagations on its neighboring wires, leaving the signal propagation on the wire to be more hampered by cross-talk with its environment. Consequently, the signal propagation speed in the first situation is better than the signal propagation speed in the second situation, hence the signal propagation on the wire in the first situation is 'accelerated' with respect to the signal propagation of the wire in the second situation. It is stipulated that the use of the verb 'to accelerate' as used in the aforementioned context should not necessarily be explained as an indication of an increase of the actual speed of a signal propagation on the wire.

Figure 4:
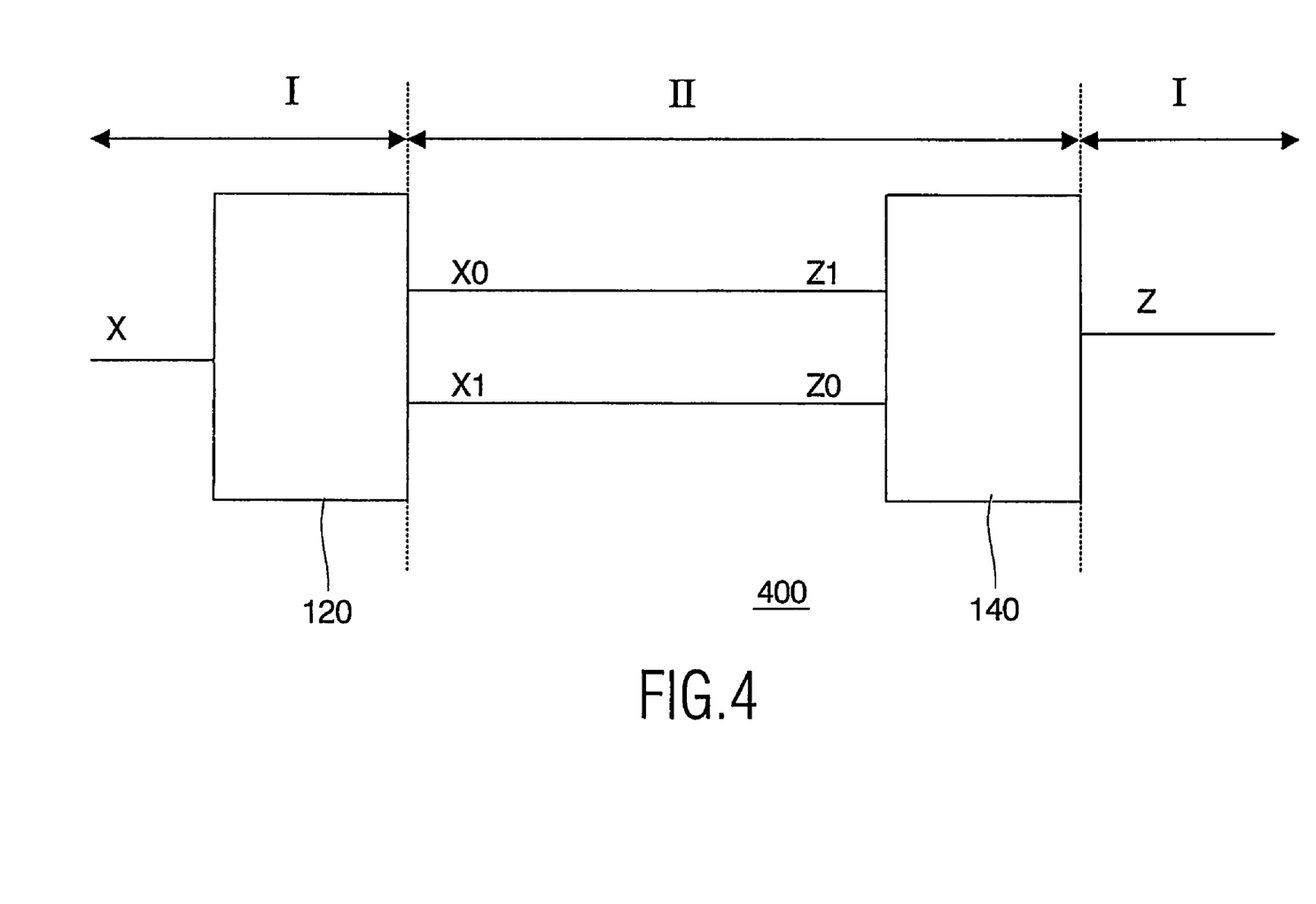
FIG. 4 shows another embodiment of delay coding according to the invention, in which embodiment an inverting gate is implemented.

FIG. 4 shows another embodiment of a delay coding circuit according to the invention, in which embodiment an inverter 400 is implemented. When X is equal to logic "0", the transition on X0 is faster than the transition on X1, resulting in a logic "1" on Z, in accordance with the conventional delay coding as explained in FIG. 1 and its detailed description. When X is equal to logic "1", the transition on X1 is faster than the transition on X0, resulting in a logic "0" on Z, in accordance with the delay coding as shown in FIG. 1.

Figure 5:
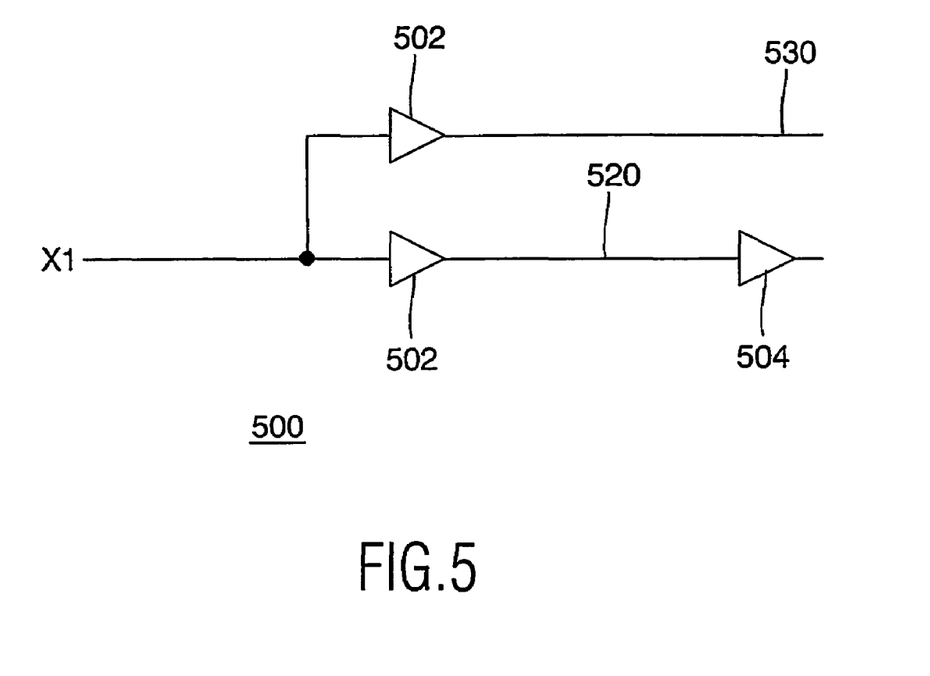
FIG. 5 shows a speed-matching gate employed in the present invention.

FIG. 5 shows a speed-matching gate 500 employed in the present invention. An important factor in interference delay logic is that signals such as the reference have the proper speed, i.e., a well-defined speed. A signal propagating over a wire in a random environment will always exhibit some delay resulting from the interaction of the wire with the environment. In contrast, a wire from an interacting wire pair employing the techniques of the present invention may have a smaller delay than the delay from a random environment, because the cross-talk with the neighboring wire in the wire pair may be reduced due to the fact that both wires may carry matching transient signals. Consequently, in an arrangement where a substantial number of gates according to the invention are cascaded, signals propagating through these gates may substantially benefit from this effect, and properly accelerated references, i.e., references that exhibit optimized signal propagation speeds resulting from advantageous signal propagations on interacting wires, which match this beneficial effect must be provided to ensure that the reference still defines the upper limit of the signal propagation speed. Speed-matching gates are thus required. An example of such a gate is illustrated in FIG. 5. The speed-matching gate 500 has two output terminals, i.e., output terminals 520 and 530. The propagation speed of the signal on the wire X1 is improved by adding an interacting open output terminal 530 to output terminal 520, the latter being coupled to a receiver 504. Drivers 502 are included in both output terminals 520 and 530 to reduce the load on the wire X1, in order to allow for an optimization of the propagation speed of the signal. Because the switching behavior on output terminal 530 matches the switching behavior on output terminal 520, the cross-talk between the output terminal 520 and its environment is reduced, thus reducing the effects of cross-talk on the output terminal 520, which improves the propagation speed of the signal on output terminal 520. Drivers 502 and receiver 504 may be implemented by any buffer or driver known from the art.

As previously mentioned, transistors are only needed in the form of delay encoders 120 and delay decoders 140 when conversion is to be done between the boolean domain I, where signal values are represented by logic levels, and the delay coding domain II where signal values are represented by the difference in arrival time of signals. The relative number of transistors used in a logical network decreases as the number of cascaded gates increases, since all logical computations can be performed in the delay coding domain II and transistors are necessary only at the interfaces between the two domains I and II. An extensive network of delay coded gates would still only need transistors at the interfaces. Possibly, simple transistor buffers, e.g. drivers 502, are used to amplify the signals propagating on the signal paths, i.e., output terminals 520 and 530. The two wires each have an own driver 502 in order for acceleration to take place. Note that the length of the two wires is a design parameter; the longer the parallel run length of the two wires, the more acceleration is obtained.

Figure 6:
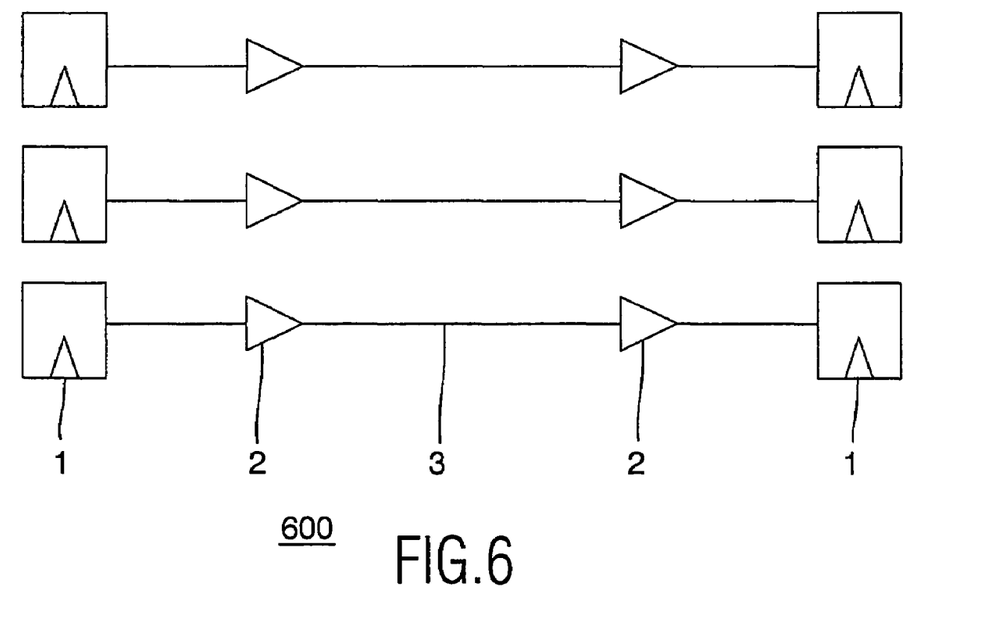
FIG. 6 shows a typical bus structure in which the present invention advantageously can be employed.

Delay coding according to the invention can preferably be used in interconnections for electrical signals. Interconnections, e.g., busses on a printed circuit board, are passive components for transmissions of bits from one place to another. FIG. 6 shows a typical bus structure 600 containing flip-flops 1, buffers 2 and wires 3 for amplification of signals propagating on the wires. By using delay coding, logical computations can be performed on the busses while transmitting the signals.

Figure 7:
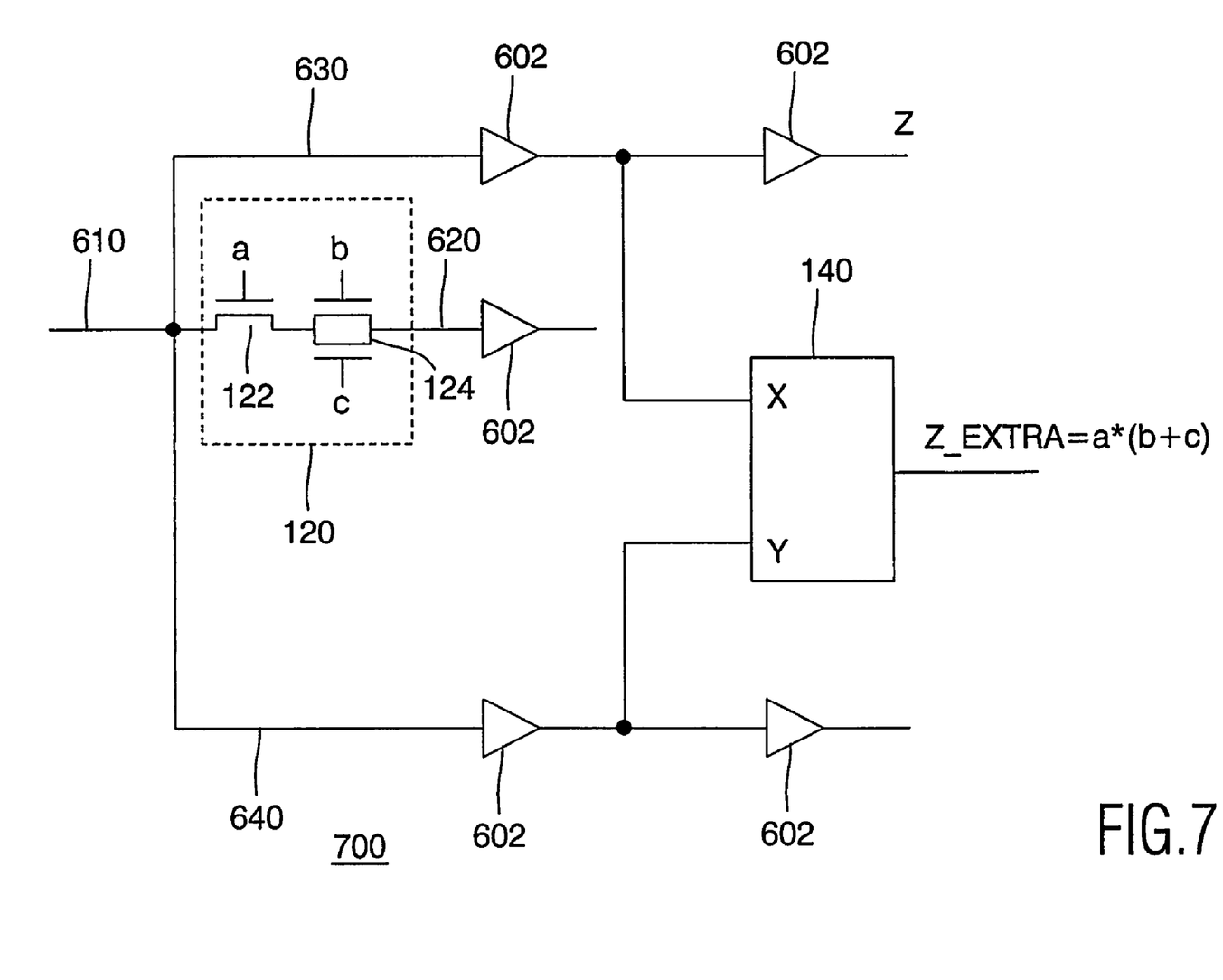
FIG. 7 shows an embodiment of delay coding according to the invention when used on a bus structure.

FIG. 7 shows a circuit 700 implementing an embodiment of delay coding according to the invention when used on a bus structure or another multiple-wire arrangement. A data wire 610 is split into a program wire 620 and a signal wire 630. As described earlier, computation can only be performed when a transition takes place on the data wire 610. The signal wire 630 and the program wire 620 must be electrically coupled to each other in order to employ the effects of cross-talk, i.e., modifying the speed of the signal propagating on the signal wire 630. Synchronization of the program wire 620 and the signal wire 630 is an important issue, since the delay modification caused by the program wire 620 on the signal wire 630 should preferably be maximised. As described earlier, a standard delay decoder 140 can be used to convert delay coded signals to binary signals by comparing the transient behavior on signal wire 630 with that of reference wire 640. The wires 610, 620, 630, 640 may be equipped with appropriate driver circuits 602 to obtain the desired signal strength on the wires.

The principle of the logic computation will be described in the following. By default, the signal propagating on the reference wire 640 (which can be shared with other signal wires) is faster than the signal propagating on the signal wire 630. This produces a logic value of "0" on the Z_EXTRA output of delay decoder 140. However, if the computation conditions are met, i.e. a*(b+c), the signal propagating on the signal wire will be accelerated by the signal propagating on the program wire 620. Hence, Z_EXTRA will be equal to logic "1" and the logical function Z_EXTRA=a*(b+c) has been implemented. By swapping the inputs X and Y of the delay decoder 140, the inverse function is implemented. It should be clear that this particular logic function merely is exemplifying, and any logic function can be implemented. As can be seen in FIG. 7, the delay encoder 120 is, as mentioned previously, implemented by means of transistors 122 and 124.

Figure 8:
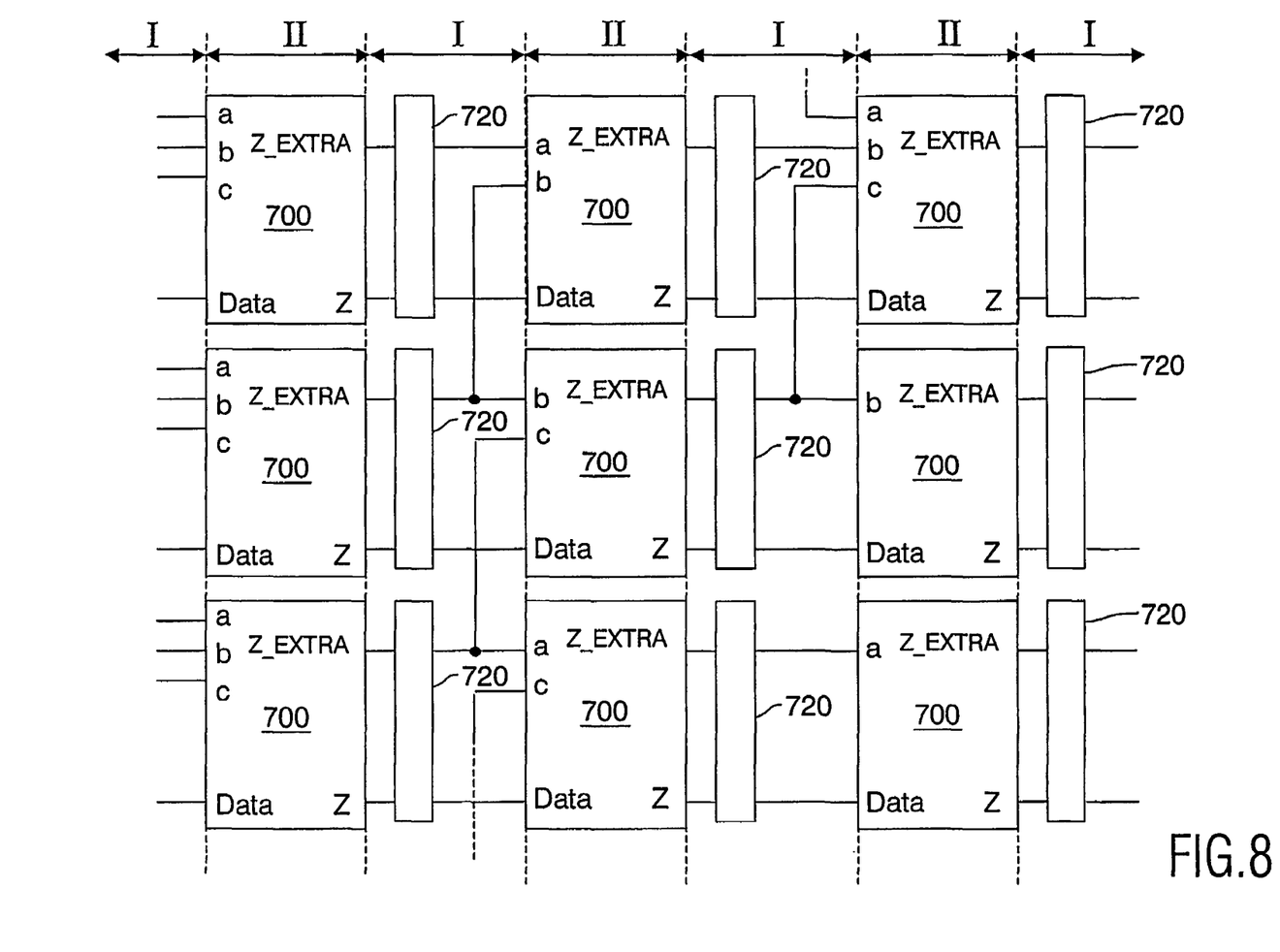
FIG. 8 shows another embodiment of delay coding according to the invention when used on bus structures.

FIG. 8 shows another embodiment of delay coding according to the invention when used on bus structures or other multiple-wire arrangements. Here, the circuit 700 in FIG. 7 is represented by a block followed by a repeater 720. The block 700 and the repeater 720 forms a stage. Each stage can perform computing and employ data from the previous stages. The conventional transmission path for busses includes the signals propagating via "Data" and "Z". Variables a, b, and c represent additional data transportation and Z_EXTRA represents additional computed data transportation. Note that data transport may take place without the performance of computation.

When cascading the stages as in FIG. 8, conversion is made from the boolean domain I to the delay coding domain II for each stage. When passing the data on to next stage, conversion is made from the delay coding domain II to the boolean domain I.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method for coding information in an electronic circuit, said circuit comprising at least two electrically coupled signal paths characterized in that the method comprises the steps of: determining an information bit to be encoded; encoding the information bit as a function of the relative delay between signals propagating on said paths when said signals make a transition from a first logic level to a second logic level; and producing as an output signal said information bit according to the relative delay between said signals.

2. The method according to claim 1, further comprising the step of: dividing a logical signal into two signals to be propagated on a respective one of said signal paths.

3. The method according to claim 1, further comprising the step of: creating a reference signal being synchronized with the fastest signal propagating on either of said signal paths.

4. The method according to claim 1, further comprising the step of: creating a relative delay between the signals propagating on said signal paths.

5. The method according to claim 1, wherein the producing step is performed by means of a delay decoder.

6. An electronic circuit for coding information, said circuit comprising at least two electrically coupled signal paths characterized in that the circuit comprises: means for determining an information bit to be encoded; means for encoding the information bit as a function of the relative delay between signals propagating on said paths when said signals make a transition from a first logic level to a second logic level; and means for producing as an output signal said information bit depending on the relative delay between said two signals.

7. The circuit according to claim 6, further comprising: means for dividing a logical signal into two signals to be propagated on a respective one of said signal paths.

8. The circuit according to claim 6, further comprising: means for creating a reference signal (D) being synchronized with the fastest signal propagating on either of said signal paths.

9. The circuit according to claim 6, further comprising: means for creating a relative delay between the signals propagating on said signal paths.

10. The circuit according to claim 6, wherein the producing means comprise a delay decoder.

* * * * *